United States Patent
Segawa et al.

(10) Patent No.: US 8,529,314 B2
(45) Date of Patent: Sep. 10, 2013

(54) METHOD OF TRANSPORTING WORK AND APPARATUS WITH WORK HANDOVER MECHANISM

(75) Inventors: Takeshi Segawa, Saitama (JP); Kiyofumi Tanaka, Kita-Adachi-gun (JP)

(73) Assignees: Lintec Corporation, Tokyo (JP); Shin-Etsu Polymer Co., Ltd., Tokyo (JP)

( * ) Notice: Subject to any disclaimer, the term of this patent is extended or adjusted under 35 U.S.C. 154(b) by 192 days.

(21) Appl. No.: 12/452,649

(22) PCT Filed: Jul. 31, 2008

(86) PCT No.: PCT/JP2008/063796
§ 371 (c)(1),
(2), (4) Date: Jan. 13, 2010

(87) PCT Pub. No.: WO2009/020050
PCT Pub. Date: Feb. 12, 2009

(65) Prior Publication Data
US 2010/0189533 A1    Jul. 29, 2010

(30) Foreign Application Priority Data

Aug. 9, 2007 (JP) .................................. 2007-208263

(51) Int. Cl.
*B24B 1/00* (2006.01)

(52) U.S. Cl.
USPC .............. 451/41; 414/805; 414/806; 414/941

(58) Field of Classification Search
USPC .......................................... 414/805, 806, 941
See application file for complete search history.

(56) References Cited

U.S. PATENT DOCUMENTS 6,887,124 B2 *   5/2005   Pinson et al. ..................... 451/5
2006/0240749 A1 * 10/2006   Yun et al. ........................ 451/41

FOREIGN PATENT DOCUMENTS

JP   A-2006-027795   2/2006
JP   A-2006-216775   8/2006

(Continued)

OTHER PUBLICATIONS

Written Opinion issued in International Patent Application No. PCT/JP2008/063796, on Sep. 2, 2008, (with English translation).
International Search Report issued in International Patent Application No. PCT/JP2008/063796, on Sep. 2, 2008 (with English translation).

(Continued)

*Primary Examiner* — Saul Rodriguez
*Assistant Examiner* — Willie Berry, Jr.
(74) *Attorney, Agent, or Firm* — Oliff & Berridge, PLC

(57) ABSTRACT

When both surfaces of a wafer are sequentially subjected to processing, the wafer is made to be surely supported so that a predetermined processing and transporting can be performed. On one surface of the wafer a first fixing jig (3a) is fixed in close contact. After having performed a predetermined processing to the opposite surface of the wafer, a second fixing jig (3b) is fixed in close contact with the opposite surface of the wafer. The first fixing jig (3a) is removed and the wafer is handed over to the second fixing jig (3b). Each of the fixing jigs is made up of a jig main body (31), and a close contact layer (32) which is disposed on one surface thereof. The jig main body has a plurality of supporting projections (33) to support the close contact layer, and a side wall (34). The close contact layer is adhered to an end surface of the side wall to thereby define a partitioned space (35) enclosed by the side wall, between the close contact layer and the jig main body. A ventilation hole (36) to be communicated with the partitioned space is formed, and the close contact layer is deformed by suction of the air within the partitioned space. At the time of removing, the close contact layer of the first fixing jig is deformed, and both the fixing jigs are relatively moved in a direction away from each other.

1 Claim, 5 Drawing Sheets

(56) References Cited

FOREIGN PATENT DOCUMENTS

| | | |
|---|---|---|
| JP | A-2006-318984 | 11/2006 |
| JP | A-2007-96085 | 4/2007 |
| JP | A-2007-157847 | 6/2007 |
| WO | WO 2005/109489 A1 | 11/2005 |

OTHER PUBLICATIONS

Office Action issued in CN 200880100914.8, dated Jan. 26, 2011.

Jul. 10, 2012 Office Action issued in Japanese Application No. 2007-208263.

* cited by examiner

METHOD OF TRANSPORTING WORK AND APPARATUS WITH WORK HANDOVER MECHANISM

TECHNICAL FIELD

The present invention relates to a method of transporting a thin plate-like work such as a semiconductor wafer and the like by using a fixing jig which fixes the work in close contact therewith, and also relates to an apparatus with a work handover mechanism.

BACKGROUND ART

In the steps for manufacturing semiconductors there are various steps such as: a back grinding step in which a rear surface of a semiconductor wafer (hereinafter simply referred to as a "wafer") is ground to miniaturize a semiconductor chip (hereinafter simply referred to as a "chip"); a dicing step in which the wafer having formed thereon a circuit is diced into respective semiconductor chips; a die bonding step in which those formed into chips are bonded to electrode portions of a surface mounting substrate having a wiring pattern thereon; and so forth.

The wafer that has been made ultrathin in the back grinding step is likely to be damaged by even the slightest shocks. Therefore, in order to prevent the wafer that has been made ultrathin from being damaged, at the time of transporting or machining, through warping by a self weight, acceleration, or processing stresses, there has been proposed a fixing jig which supports and fixes the wafer and which is made up of a plate-like jig main body, and a close contact layer which is provided on one surface of the jig main body and which detachably holds the work in close contact (see, e.g., patent document 1). This jig main body has on one surface a plurality of supporting projections which support thereon the close contact layer and also has, along an outer peripheral portion of said one surface, a side wall of substantially the same height as the supporting projections. The close contact layer is adhered to an end surface of the side wall. Between the close contact layer and the jig main body, there is defined a partitioned space which is enclosed by the side wall. The jig main body has formed therein a ventilation hole which is in communication with the partitioned sp ace.

As long as the wafer is held in close contact with this fixing jig, the wafer is held without a positional deviation and damages thereto. On the other hand, when the air within the partitioned space is sucked by evacuation of the ventilation hole, the close contact layer is deformed so as to be dented at the position between the respective supporting projections, and the area of contact of the wafer with the close contact layer will decrease. As a result, the wafer can be removed from the fixing jig without applying a further undue force to the wafer.

Due to the above advantages of the fixing jig, it is proposed: to prepare a protecting structural body for the wafer in which, by fixing the wafer in close contact with the fixing jig, the wafer and the fixing jig are integrated; and to perform the back grinding step and the like or to transport the wafer to the subsequent step in a state of maintaining this protecting structural body.

Patent Document 1: JP-A-2006-216775

DISCLOSURE OF THE INVENTION

Problems to be Solved by the Invention

By the way, in the above steps for manufacturing semiconductors, there are cases where, after having performed a predetermined processing on one surface of the wafer (i.e., on the surface opposite to the surface that is in close contact with the fixing jig), another predetermined processing is performed in the subsequent step on the other surface of the wafer (i.e., on the surface in close contact with the fixing jig). In such a case, if the wafer must be once removed from the state of being in the protecting structural body, and the wafer is reversed upside down to thereby bring the wafer into close contact with the fixing jig again, not only is the workability poor, but also is there a possibility that the ultrathin wafer is damaged at the time of upside-down reversal of the wafer.

On the other hand, there is conventionally known a method in which that surface of the wafer which has been processed is fixed to a ring frame by adhesion through an adhesive tape, and the fixing jig is then removed to thereby hand over the wafer to the ring frame. In this method, however, the bearing (supporting) properties of the wafer are insufficient at the adhesive tape portion, and this method is applicable only to a processing table which fits the size of the ring frame. In addition, there is a problem in that the adhesive tape is disposable (throwaway type), thereby bringing about a higher cost.

In view of the above points, the problem of this invention is to provide a low-cost work transporting method in which, when both surfaces of a thin plate-shaped work must be sequentially processed, performing a predetermined processing on the work and transporting the work can be done in a state in which the work is surely held, and also to provide an apparatus having a work handover mechanism.

Means for Solving the Problems

In order to solve the above problems, the method of transporting a work according to claim 1 comprises the steps of fixing a first fixing jig in close contact with one surface of a thin plate-like work and performing a predetermined processing on an opposite surface of the work, or fixing a first fixing jig in close contact with one surface of a thin plate-like work in which said one surface has been subjected to a predetermined processing; and subsequently fixing a second fixing jig in close contact with the opposite surface of the work; and handing over the work to the second fixing jig by removing the first fixing jig from the work. Each of the first fixing jig and the second fixing jig comprises a plate-like jig main body, and a close contact layer which is disposed on one surface of the jig main body so as to detachably hold the work in close contact with the close contact layer. The jig main body has on said one surface thereof a plurality of supporting projections which support the close contact layer, and a side wall along a peripheral portion of said one surface of the jig main body. The side wall has substantially an equal height as the supporting projections, and the close contact layer is adhered to an end surface of the side wall thereby defining a partitioned space enclosed by the side wall between the close contact layer and the jig main body. The jig main body has formed therein a ventilation hole which is in communication with the partitioned space such that the close contact layer is deformed by sucking air within the partitioned space via the ventilation hole. The removing of the first fixing jig from the work is performed, after having deformed the close contact layer of the first fixing jig, by relatively moving the first fixing jig and the second fixing jig away from each other.

In addition, in order to solve the above problems, there is provided an apparatus with a work handover mechanism, in which a thin plate-like work to which a first fixing jig is fixed in close contact therewith is handed over to a second fixing jig. Each of the first fixing jig and the second fixing jig comprises: a plate-like jig main body; and a close contact layer which is disposed on one surface of the jig main body so as to detachably hold the work in close contact with the close contact layer. The jig main body has: on said one surface thereof a plurality of supporting projections which support the close contact layer; and a side wall along a peripheral portion of said one surface of the jig main body. The side wall has substantially an equal height as the supporting projections, and the close contact layer is adhered to an end surface of the side wall thereby defining a partitioned space enclosed by the side wall between the close contact layer and the jig main body. The jig main body has formed therein a ventilation hole which is communicated with the partitioned space such that the close contact layer is deformed by sucking air within the partitioned space via the ventilation hole. The work handover mechanism comprises: an attaching/detaching portion provided with a through hole which is communicated with the ventilation hole of the first fixing jig and which is connected to a suction means; a transporting means which is capable of supporting the work or the fixing jig, and having a finger portion which is formed in a manner to be reversible upside down. The apparatus comprises a jig standby portion which temporarily stores the fixing jigs after having handed over the work.

Effects of the Invention

According to this invention, by using two fixing jigs, the work is handed over between the two fixing jigs. Therefore, out of the two fixing jigs, that surface of the work which is to be processed can be opened only by changing the fixing jig to which the work is to be fixed in close contact therewith. As a result, the workability can be remarkably improved when the work is transported while reversing that surface of the work which is to be processed in the subsequent step, as compared with an example in which the work itself is to be reversed in a state in which there is no supporting member available. In addition, not only while performing a predetermined processing on the work and while transporting the work, but also while handing over the work between the two fixing jigs, there will be formed a protecting structural body for the work in which the work is surely held by the fixing jig. Therefore, even if the work is ultrathin, the work can be prevented from being damaged.

As described hereinabove, according to this invention, without using a sheet and the like for protecting the surface of the work, the work can be subjected to a predetermined processing on both surfaces thereof by sequentially transporting the work by using the reusable fixing jigs. As a result, various problems associated with a high cost, increase in wastes and the like by making use of protection sheets can be efficiently solved.

BEST MODE FOR CARRYING OUT THE INVENTION

With reference to FIG. 1, reference numeral 1 denotes a wafer transport apparatus for transporting a wafer W which is a thin plate-like work according to this invention. The wafer transport apparatus 1 has a supporting rack 2 which is rectangular as seen in plan view, and is disposed between a predetermined apparatus for performing an upstream step (hereinafter referred to as "an upstream apparatus") 10a and a downstream apparatus for performing a predetermined downstream step (hereinafter referred to as "a downstream apparatus") 10b. After having performed by the upstream apparatus 10a a predetermined processing on one surface of the wafer W, the wafer transport apparatus 1 is transported to the downstream apparatus 10b with the other surface to be processed left open in order to perform a predetermined processing on the other surface of the wafer W.

The upstream apparatus 10a and the downstream apparatus 10b are provided with protecting structural body housing portions S1, S2 which are disposed with each opened face facing the wafer transport apparatus 1. In the protecting structural body housing portion S1 of the upstream apparatus 10a, a plurality of wafers W are housed (or stacked) at a predetermined vertical distance from one another in a state in which wafers W are fixedly supported (referred to as "a protecting structural body 30a") by the fixing jig 3a to be described hereinafter. It may alternatively be so arranged that the wafer W and the fixing jig 3 are housed in a cassette of a known structure so as to dispose them in a predetermined position of the upstream apparatus 10a by means of a handling apparatus. Further, the protecting structural body housing portion S2 is so arranged that a plurality of wafers W can be housed at a predetermined vertical distance from one another in a state in which the wafers W are fixedly supported (referred to as "a protecting structural body 30b") by the fixing jig 3b to be described hereinafter.

Here, the fixing jig 3 for fixedly supporting the wafer W is made up of a plate-like jig main body 31, and a close contact layer 32 which is disposed on one surface of the jig main body 31 (see FIGS. 2(a) and 2(b)). The jig main body 31 is formed into a circular disc shape which is slightly larger in diameter than the wafer W. The material in which the jig main body 31 is made is not particularly limited as long as it is superior in mechanical strength. The material may for example, be: a metallic material such as an aluminum alloy, magnesium alloy, stainless steel, and the like; a resin forming material such as polyamide, polycarbonate, polypropylene, acrylic resin, polyvinyl chloride, and the like; an inorganic material such as glass; and an organo-mineral composite material such as glass fiber reinforced epoxy resin, and the like.

On one surface of the jig main body 31 there are formed a plurality of columnar supporting projections 33 of about 0.05~0.5 mm in height and about 0.05~1.0 mm in diameter at a pitch of about 0.2~2.0 mm. Further, on an outer peripheral portion of the jig main body 31, there is formed a cylindrical side wall 34 in a height substantially equal to that of the supporting projections 33. The supporting projections 33 may be formed in shape other than columnar shape, e.g., in truncated conical shape. On the other hand, the opposite surface of the jig main body 31 shall preferably be machined to a smooth surface so as to have a predetermined surface roughness.

The close contact layer 32 is formed of a film of 20~200 μm thick made of elastomer of urethane based, acrylic-based, fluorine-based, silicone-based, and the like which is superior in flexibility, plasticity, heat resistance, elasticity, adhesiveness, etc. The outer peripheral portion of the close contact layer 32 is adhered to the end surface of the side wall 34 of the jig main body 31 by means of an adhesive, heat sealing, and the like. According to this arrangement, there is defined a partitioned space 35 enclosed by the side wall 34 between the close contact layer 32 and the jig main body 31. In addition, the close contact layer 32 is supported by coming into contact with flat end surfaces of the supporting projections 33. The jig main body 31 has formed therein at least one ventilation hole 36 which penetrates the jig main body 31 in the direction of the thickness thereof into communication with the partitioned space 35.

In the central portion of the working surface 2a of the supporting rack 2, there is provided an articulated type of transport arm (transporting means) 4 of a known construction (see FIGS. 1 and 3). The front end portion of the transport arm 4 is formed as a finger portion 41 of substantially U-shape as seen in plan view. At least one surface of the finger portion 41 has formed therein a suction hole 42. It is thus so arranged that the wafer W and/or the fixing jig 3 can be transported in a state in which the wafer and/or the fixing jig is kept sucked by the finger portion 41. This suction hole 42 is disposed so as not to coincide with the ventilation hole 36 of the fixing jig 3 so that, when the fixing jig 3 is suctioned and fixed, the partitioned space 35 is not reduced in pressure.

Further, this finger portion 41 can be reversed upside down by a motor 43 as a reversing mechanism, and a mounting shaft 44 for mounting the transport arm 4 to the working surface 2a is coupled to a driving means such as a cylinder and the like. The finger portion 41 is thus arranged to be movable up and down in a direction perpendicular to the working surface 2a. The transport arm 4 may be provided in two sets on the working surface 2a of the supporting rack 2, one to be exclusively used for the first fixing jig 3a, and the other to be exclusively used for the second fixing jig 3b as described in detail hereinafter.

On one end in the longitudinal direction of the working surface 2a of the supporting rack 2 (right side in FIG. 1), there is provided an attaching/detaching portion 5 in which attaching or detaching of the fixing jig 3 to and from the wafer W is performed. In this case, the transport arm (transporting means) 4 and the attaching/detaching portion 5 constitute a wafer handover (transfer) mechanism. The attaching/detaching portion 5 is provided with: a recessed portion 6 which is formed in the working surface 2a of the supporting rack so as to substantially coincide with an outer shape of the fixing jig 3; and a plurality of lifting pins 7 which are built in the supporting rack 2 (see FIGS. 1 and 4). In order to hand over the fixing jig from the transport arm 4, the lifting pins 7 is arranged to be reciprocated by an air cylinder (not illustrated) between a lifted position in which the lifting pins protrude beyond the working surface 2a, and a lowered position in which the lifting pins are housed inside the supporting rack 2.

The attaching/detaching portion 5 has a through hole 8 which is in communication with the ventilation hole 36 of the fixing jig 3 when the fixing jig 3 is set in position in the recessed portion 6. This through hole 8 has connected thereto a vacuum pump (suction means) V via a bellows pipe (not illustrated). In this case, the bottom of the recessed portion 6 may be provided with an O ring in a manner to enclose the periphery of the through hole 8.

When the fixing jig 3 is set in position by dropping the fixing jig 3 into the recessed portion 6 as a result of lowering of the lifting pins 7, the ventilation hole 36 of the fixing jig 3 is brought into communication with the through hole 8. When the air within the partitioned space 35 is sucked by evacuation with the vacuum pump V via the through hole 8 and the ventilation hole 36, the close contact layer 32 will be deformed so as to be dented at the position between the respective supporting projections 33, and the area of contact of the wafer W with the close contact layer 32 will decrease. As a result, the wafer W can be removed from the fixing jig 3 without applying an undue force to the wafer W.

Further, on the other end in the longitudinal direction of the working surface 2a of the supporting rack 2 (left side in FIG. 1), there is provided a jig standby portion S3. In the jig standby portion S3 there is temporarily stored at least one fixing jig 3 at a predetermined distance in the vertical direction. In FIG. 1 the fixing jig 3 is housed in a cassette of known construction and is disposed by a handling apparatus into a predetermined position on the working surface 2a. Alternatively, it will be sufficient if a space is reserved for temporarily placing a single piece of fixing jig 3.

A description will now be made of the operation of the wafer transport apparatus 1 according to this invention. First, a single protecting structural body 30a is taken out of the protecting structural body housing portion S1 by the transport arm 4 to transport it to the attaching/detaching portion 5. At this time, that side of the fixing jig 3 which lies on the side of the jig main body 31 is sucked by the finger portion 41, the finger portion 41 is appropriately moved upside down and the protecting structural body 30a is transported so as to lay the wafer W on the upper side.

Before the protecting structural body 30a reaches the attaching/detaching portion 5 by the transport arm 4, the lifting pins 7 are moved upward to hand over the protecting structural body 30a to the lifting pins 7. Once the protecting structural body 30a is supported by the lifting pins 7, the suction by the transport arm 4 is released and then the transport arm 4 is retreated. Subsequently, once the lifting pins 7 are returned to the lowered position, the first fixing jig 3a is set in position in the recessed portion 6 of the attaching/detaching portion 5. The protecting structural body 30a is thus fixed to the wafer transport apparatus T (see FIGS. 4(a) and 4(b)).

Subsequently, a fixing jig 3, i.e., the second fixing jig 3b is taken out of the jig standby portion S3 by the transport arm 4 by holding through sucking that side of the second fixing jig 3b which lies on the side of the jig main body 31, and transports it to the attaching/detaching portion 5. At this time, the close contact layer 32 of the fixing jig 3b is arranged to lie on the lower side. Then, the close contact layer 32 of the second fixing jig 3b is caused to come into contact with the entire surface of the wafer W of the protecting structural body 30a. The transport arm 4 is slightly moved downward to thereby apply a pressing force so that the wafer W is brought into close contact with the second fixing jig 3b (see FIG. 4(c)).

Then, by evacuating the through hole 8 and the ventilation hole 36 by operating the vacuum pump V, the air within the partitioned space 35 is sucked via the ventilation hole 36. Then, the close contact layer 32 of the first fixing jig 3a is deformed in a manner to be dented at the position between the respective supporting projections 33. The area of contact of the wafer W with the close contact layer 32 will decrease, so that the wafer W becomes removable from the first fixing jig 3a. Then, when the second fixing jig 3b is moved right above by the transport arm 4 so that both the fixing jigs 3a, 3b can be departed from each other, the first fixing jig 3a is completely removed from the wafer W. The wafer W is thus handed over to the second fixing jig 3b and, as a result, the protecting structural body 30b is formed (see FIG. 4(d)).

Then, the protecting structural body 30b made up of the second fixing jig 3b and the wafer W is transported by the transport arm 4 to the protecting structural body housing portion S2 in the downstream apparatus 10b and is housed therein. In addition, the first fixing jig 3a that remains in the recessed portion 6 of the attaching/detaching portion 5 is transferred by the transport arm 4 to the jig standby portion S3, and is temporarily housed therein as the second fixing jig 3b for processing the next wafer W. Finally, by means of a processing mechanism (not illustrated) of a downstream apparatus 10b, processing is performed on the open surface of the wafer W in a state of the protecting structural body 30b, i.e., on that side of the surface which was covered with the first fixing jig 3a.

As described hereinabove, according to this embodiment, it is so arranged that the wafer W is handed over by using two fixing jigs 3a, 3b. Therefore, out of both the fixing jigs 3a, 3b, only by changing the fixing jig to which the wafer W is to be in close contact therewith, that surface of the wafer W which is to be processed can be left open. As a result, the workability at the time of transporting the wafer W to the subsequent step while reversing that surface of the wafer W which is to be processed, can be improved as compared with the workability of the case in which the wafer W itself is reversed. Once the wafer W has been fixed in close contact with the fixing jig 3, the protecting structural bodies 30a, 30b are formed in which the wafer W is surely held by means of the fixing jig 3 not only during the time when a predetermined processing is performed on the wafer W and during transportation of the wafer W, but also when the wafer W is handed over between both the fixing jigs 3a, 3b. Therefore, even an ultrathin wafer W will not be damaged.

According to this embodiment as described above, without using an adhesive sheet and the like which is to be thrown away after each use, the wafer W can be sequentially transported by using two reusable fixing jigs 3a, 3b so that a predetermined processing can be performed on both surfaces of the wafer W. Therefore, various problems such as an increase in cost accompanied by the use of an adhesive sheet, an increase in wastes, and the like can be effectively solved.

In this embodiment a description has been made of an example in which the wafer transport apparatus 1 is constituted as an independent apparatus. It may, for example, be so arranged that the work transport apparatus of this invention is incorporated into a grinding apparatus 20 of a known construction for grinding a wafer.

In other words, as shown in FIG. 5, the grinding apparatus 20 has a supporting rack 21. The working surface 22 of this supporting rack 21 is provided with a rotary table 23 with a stepping motor so as to intermittently stop at every predetermined rotation angle. On the rotary table 23 there are provided four chuck tables 24 at a predetermined distance from one another in the circumferential direction. The chuck table 24 is constituted, e.g., by a porous table so that the wafer can be detachably sucked and fixed by suction at a negative pressure.

Above the working surface 22 there are provided in a suspended manner a rough grinding apparatus 25 and a finish grinding apparatus 26, both of a known construction, as seen from an upstream side of rotation, at a position to correspond to the stopping position of the chuck tables 24. On the working surface 22 of the supporting rack 21, there are disposed a transport arm 4a and an attaching/detaching portion 5 in which attaching or detaching of the fixing jig 3 to and from the wafer W is performed in a manner similar to the above embodiment.

In this grinding apparatus 20; at a predetermined position on the working surface 22, there are disposed: a wafer housing portion SA in which a plurality of wafers W are housed or stored in a vertical direction at a predetermined distance from one another; a jig housing portion SB in which a plurality of fixing jigs 3 are housed in a vertical direction at a predetermined distance from one another; and a protecting structural body housing portion SC in which a plurality of wafers W are housed in a vertical direction at a predetermined distance from one another, in a state in which the wafers W are supported by, and fixed to, the fixing jigs 3. In addition, in order to change that surface of the wafer W which is to be processed by changing the close contact surface of the wafer W with the fixing jig 3, there is provided a jig standby portion SD and another transport arm 4b which is of the same construction as the transport arm 4a.

Then, a wafer W is taken out of the wafer housing portion SA by means of the transport arm 4a by sucking and holding that surface of the wafer W on which grinding processing is to be performed. The wafer W is then transported to the chuck table 24, out of those on the rotary table 23, which is positioned in the carry-in position A. At this time, depending on the state of storing in the wafer housing portion SA, the transport arm 4a is appropriately reversed upside down so as to lay that surface of the wafer W which is to be processed (the close-contact surface side) on the upper side.

Subsequently, the rotary table 23 is rotated so as to move the wafer W to the rough grinding position B below the rough grinding apparatus 25 so as to perform rough grinding of the rear surface or the wafer W to a predetermined thickness. Subsequently, by further rotating the rotary table, the wafer W is moved to a finishing position C below the finish-grinding apparatus. That rear surface of the wafer W which has been ground to the predetermined thickness is finish-ground and washed.

Subsequently, by further rotating the rotary table 23, the wafer W that has been ground is moved to the discharge position D. When the wafer W that has finished grinding reaches the discharge position D, a fixing jig 3, i.e., the first fixing jig 3a is taken out of the jig housing portion SB by means of the transport arm 4a and transport it to the discharge position D. At this time, that side of the fixing jig 3a which lies on the side of the jig main body 31 is sucked by means of the finger portion 41. The finger portion 41 is appropriately moved upside down so that the close contact layer 32 of the fixing jig 3 lies on the lower side.

Then, the close contact layer 32 of the first fixing jig 3a is brought into contact, over the entire surface thereof, with the upper surface (the surface that has been ground) of the wafer W in the discharge position. By slightly moving the transport arm 4a downward, a pressing force is applied. As a result, the wafer W is fixed by being brought into close contact with the first fixing jig 3a, whereby there is formed a protecting structural body 30a by integration of the wafer W and the fixing jig 3a.

Subsequently, this protecting structural body 30a is transported to the attaching/detaching portion 5 by means of the transport arm 4a. At this time, the finger portion 41 is moved upside down and transports so as to bring that surface of the wafer W which has been processed on the upper side. Also, the lifting pins 7 are moved to the lifted position and the protecting structural body 30a is handed over to the lifting pins 7. By then lowering the lifting pins 7 the protecting structural body 30a is set in position on the attaching/detaching portion 5.

Then, a fixing jig 3 is taken out of the jig standby portion SD by means of the transport arm 4a, in other words, the second fixing jig 3b is taken out by holding through suction the side of the jig main body 31, and transport it to the attaching/detaching portion 5. At this time, the close contact layer 32 of the fixing jig 3b is arranged to lie on the lower side. In this case, as the second fixing jig 3b, there is used the first fixing jig 3a that was left in the attaching/detaching portion 5 after having been used in the previous processing and that was transferred by the transport arm 4a to the jig standby portion SD for temporarily storing therein. It may also be so arranged, on the working surface 22, that the first fixing jig 3a that was left in the attaching/detaching portion 5 is housed once again by means of the transport arm 4b into the original jig storing portion SB.

Then, the close contact layer 32 of the second fixing jig 3b is brought into contact, over the entire surface thereof, with the surface of the wafer W of the protecting structural body 30a in the attaching/detaching portion 5. The transport arm 4 is moved slightly downward to apply a pressing force, thereby bringing the wafer W into close contact with the second fixing jig 3b.

Then, by evacuation of the through hole 8 and the ventilation hole 36 by operating the vacuum pump, the air within the partitioned space 35 is sucked via the ventilation hole 36. As a result, the close contact layer 32 of the first fixing jig 3a is deformed so as to be dented at the position between the respective supporting projections 33. The area of contact of the wafer W with the close contact layer 32 will decrease, so that the wafer W becomes a state in which the wafer W can be removed from the first fixing jig 3a. Then, when the second fixing jig 3b is moved directly above by the transport arm 4 so that both the fixing jigs 3a, 3b can be departed from each other, the first fixing jig 3a is completely removed from the wafer W. The wafer W is thus handed over to the second fixing jig 3b and, as a result, forms the protecting structural body 30b. The protecting structural body 30b is housed by the transport arm 4b into the protecting structural body housing portion SC. The cassette is transferred to the processing apparatus of the subsequent step.

Subsequently, in order to perform a predetermined processing on the circuit surface (the surface that is opposite to the ground surface) of the wafer W in the subsequent step, e.g., in the dicing step, the wafer W is transported by another transport arm (not illustrated), in the state of the protecting structural body 30b, to the dicing apparatus which performs the dicing step. On the other hand, the first fixing jig 3a that was left in the attaching/detaching portion 5 is returned by the transport arm 4a to the jig standby portion SD.

A further description will now be made of the method of transporting according to this invention which is used in other steps for processing a wafer W.

As a first example, reference can be made to processing steps including a back-grinding step in which an upstream apparatus 10a is a wafer grinding apparatus, and a die bond film bonding step in which a downstream apparatus 10b is a die bond film (also called a die attach film; DAF) bonding apparatus.

First, a surface protection sheet is adhered to the circuit surface of an unground wafer W in which a circuit pattern has been built in a previous step. The wafer W is then mounted on a wafer grinding apparatus which is the upstream apparatus 10a, thereby performing the grinding of the wafer W. Since the wafer W that has been ground to an ultrathin thickness is very fragile, the fixing jig 3a is fixed in close contact with the ground surface while left on the stage of the wafer grinding apparatus. The protecting structural body 30a thus obtained is a structure which is made up, in the order as described, of the fixing jig 3a, the wafer W (the side on the fixing jig is the ground surface), and the surface protection sheet.

Subsequently, by using the wafer transport apparatus 1 according to this invention, the protecting structural body 30a is handed over from the fixing jig 3a to the fixing jig 3b to thereby form a protecting structural body 30b. The method of handing over is as described earlier. The protecting structural body 30b thus obtained becomes a structure which is made up, in the order as described, of the fixing jig 3b, the surface protection sheet, and the wafer W (the ground surface is left exposed).

Then, the protecting structural body 30b is transported to the apparatus for adhering a die bond film, which apparatus is a downstream apparatus 10b, and a die bond film is adhered to the side of the ground surface of the wafer W. The wafer W to which the die bond film has been adhered is subjected to the predetermined steps such as the step of peeling the surface protection sheet, the dicing step, the die bonding step, and the like. The step of peeling the surface protection sheet may also be performed before the DAF adhering step. In these steps it is preferable to perform the processing in a state in which the wafer is supported by, and fixed to, the fixing jig 3.

As a second example, reference can be made to the processing steps including the dicing step in which the upstream apparatus 10a is a dicing apparatus, and the chip sorting step in which the downstream apparatus 10b is a pick-up apparatus.

First, a surface protection sheet is adhered to the circuit surface of an unground wafer W in whose surface a circuit pattern has been built in a previous step. Further, on top of the surface protection sheet, a first fixing jig 3a is fixed in close contact with the surface protection sheet. Subsequently, the wafer W is placed on a wafer grinding apparatus which is an upstream apparatus 10a, and grinding is performed from the rear surface side of the wafer W until a predetermined thickness is attained. The protecting structural body 30a thus obtained is a structure which is made up, in the order as described, of the fixing jig 3a, the surface protection sheet, and the wafer W (with the ground surface being exposed).

Then, the wafer W is transported, in a state of being the protecting structural body 30a, to the dicing apparatus which is an upstream apparatus in the first example. In the dicing apparatus, the dicing of the wafer W is performed by cutting down to part of the thickness of the surface protection sheet, and the wafer W is made into chips. In this manner, there can be obtained a protecting structural body 30a which is made up of the fixing jig 3a, the surface protection sheet, and the chips (works).

Subsequently, by using the wafer transport apparatus 1 according to this invention, the protecting structural body 30a is handed over from the fixing jig 3a to the fixing jig 3b, to thereby form the protecting structural body 30b. The method of handing over is as described earlier, and the obtained protecting structural body 30b will be a structure made up, in the order as described, of the fixing jig 3b, the chip (the ground surface lies on the side of the fixing jig), and the surface protection sheet.

Then, the protecting structural body 30b is transported to the sheet peeling apparatus which is a downstream apparatus 10b, where the surface protection sheet is peeled off from the chip. Further, the protecting structural body 30b is transported to the pickup apparatus, where each of the chips is subjected to die bonding on a predetermined substrate, or transferred to the chip tray. As the pickup apparatus, there can be used an apparatus which has a function of reducing the pressure in the partitioned space 35 via the ventilation hole 36 of the fixing jig 3b. By reducing the pressure in the partitioned space 35, the close contact layer 32 of the fixing jig 3b can be deformed, and the close contact of all the chips fixed to the fixing jig 3b can be weakened. According to this arrangement, there is no possibility of giving damages to the chips.

The embodiment of this invention is not limited to the steps described above. This invention can be applied to the transportation between the other steps. In addition, this invention can also be applied to the transportation between the steps in which the order or the combination of the steps is different from the aforementioned.

Further, in this embodiment, a description has been made of an example in which that surface of the wafer W which is to be processed is transported upside down. This invention can similarly be applied to the fixing jig which is used in processing thin plate works other than wafers W, such as precision substrates made of quartz glass, and the like.

Figure 1:
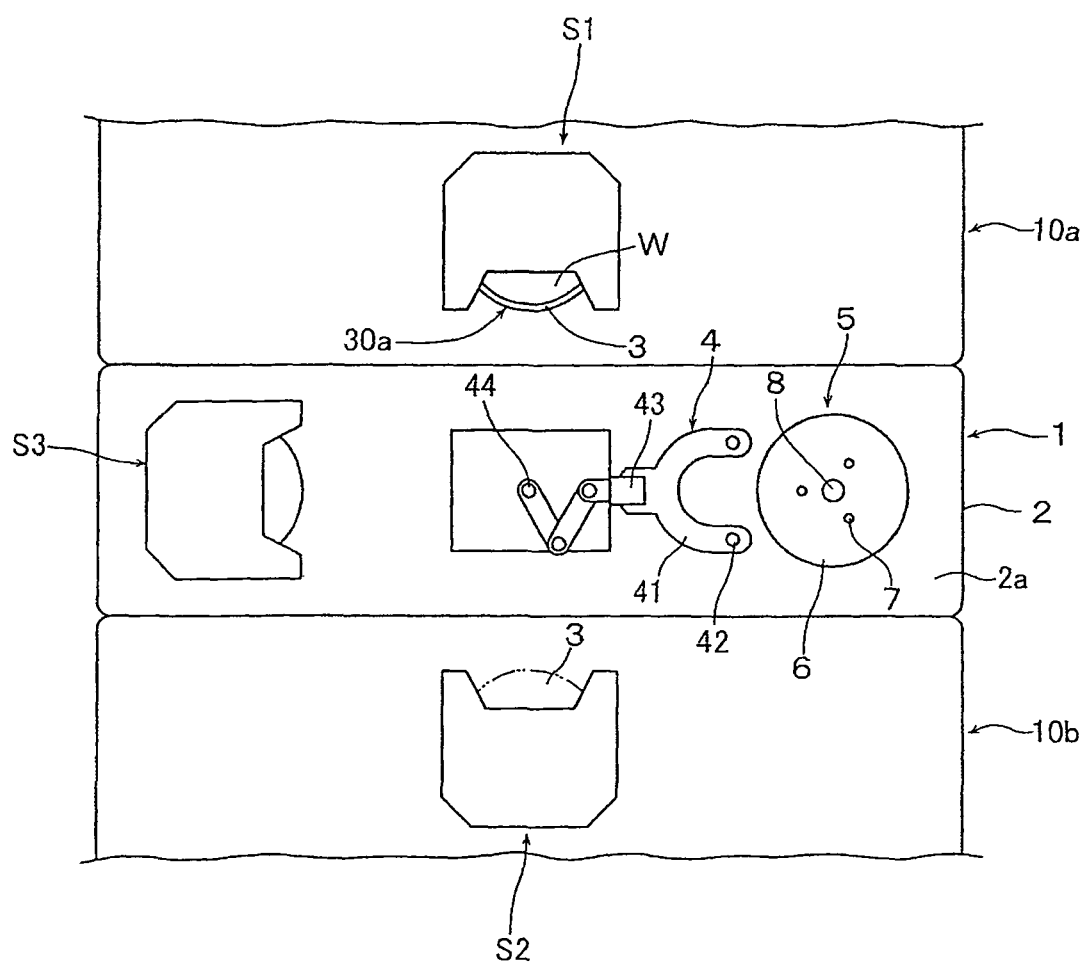
FIG. 1 is a schematic plan view of a wafer transport apparatus according to an embodiment of this invention.
Figure 2A:
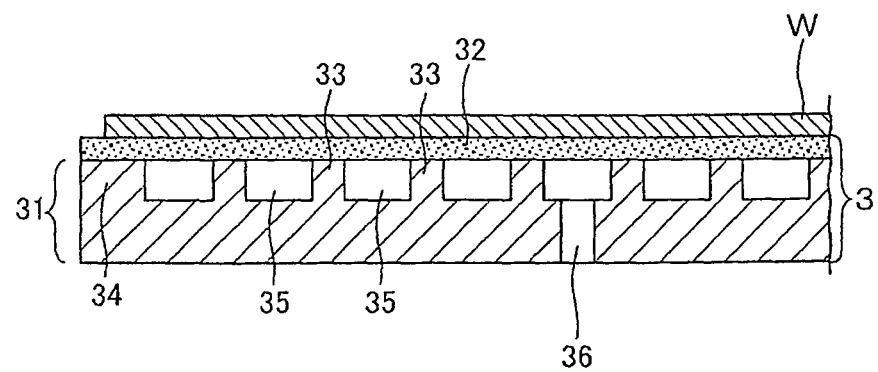
FIG. 2(*a*) is a schematic sectional view of a fixing jig to be used in the wafer transport apparatus of this invention, and FIG. 2(*b*) is a plan view of a jig main body of the fixing jig.
Figure 2B:
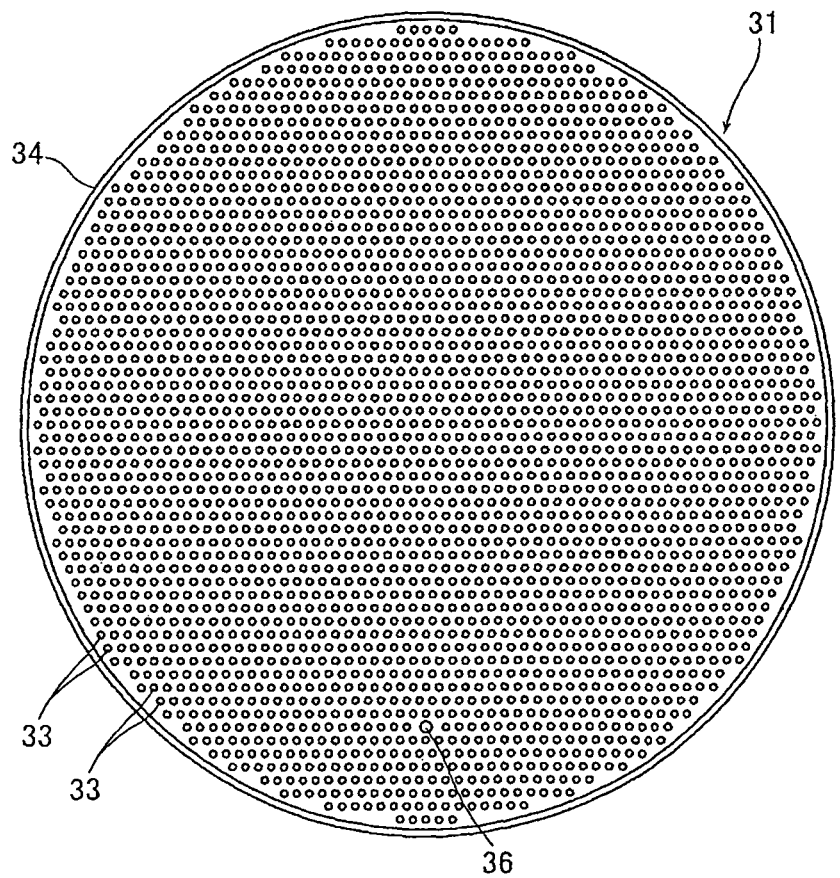
Figure 3:
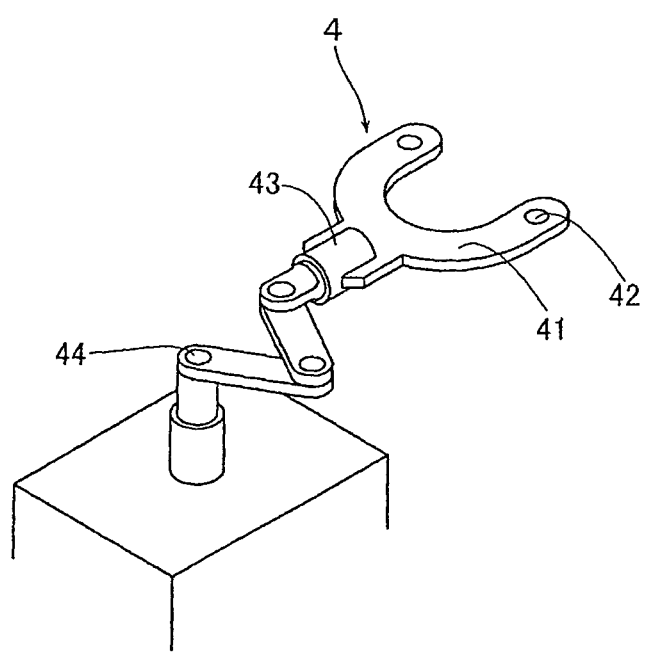
FIG. 3 is a schematic perspective view of a transport arm.
Figure 4A:
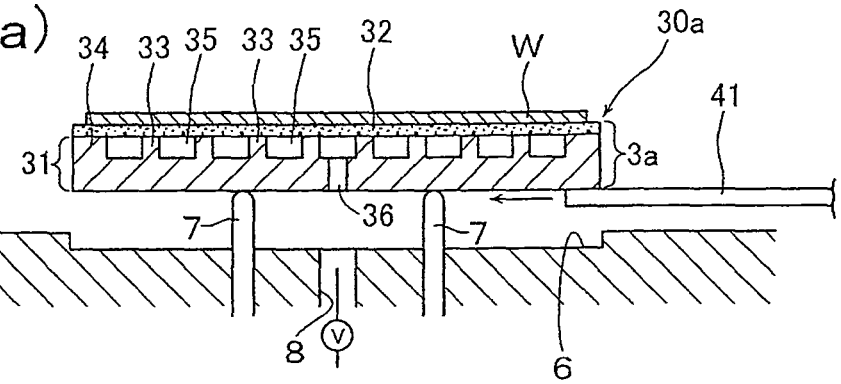
FIGS. 4 (*a*) through 4(*d*) are schematic sectional views explaining the handing over of the wafer between the fixing jigs.
Figure 4B:
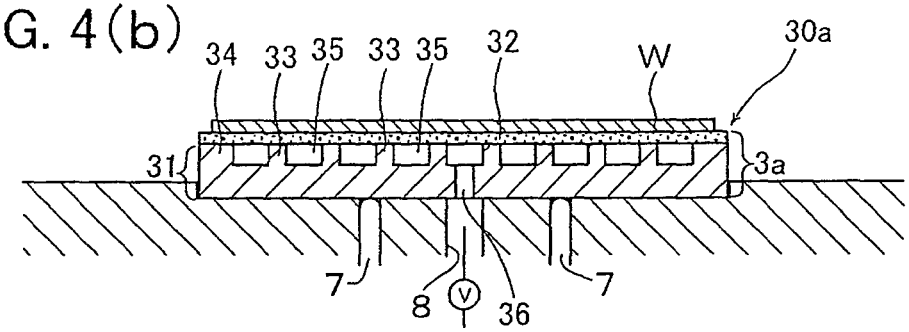
Figure 4C:
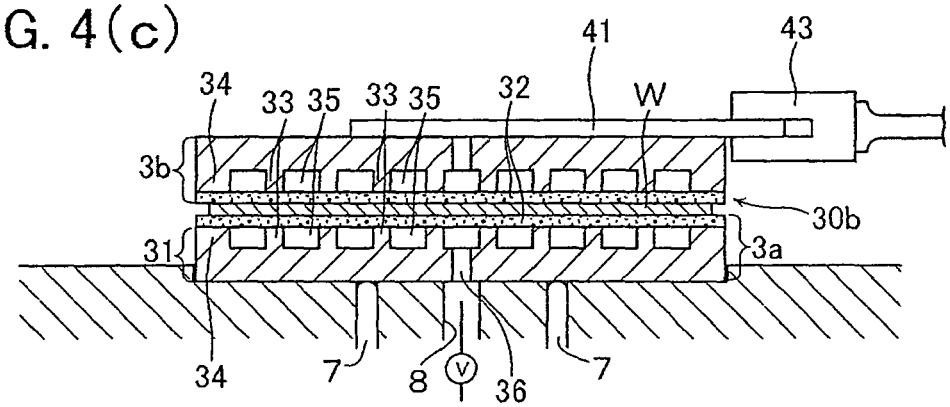
Figure 4D:
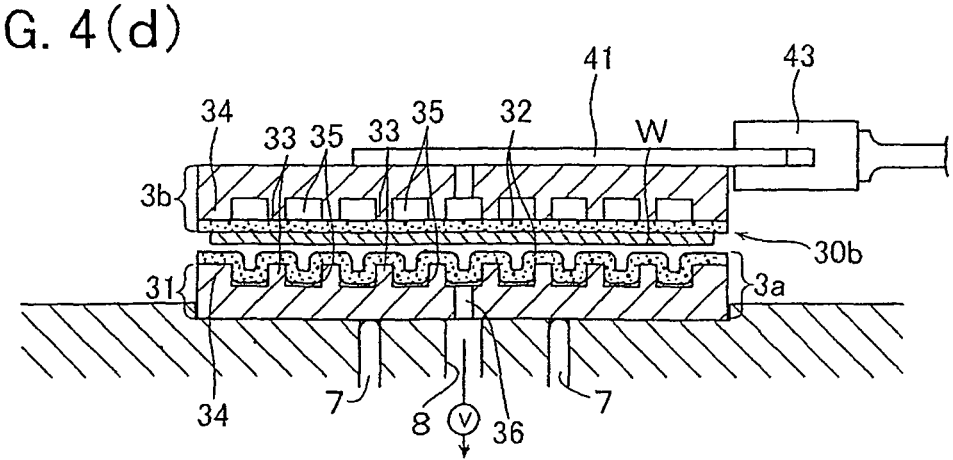
Figure 5:
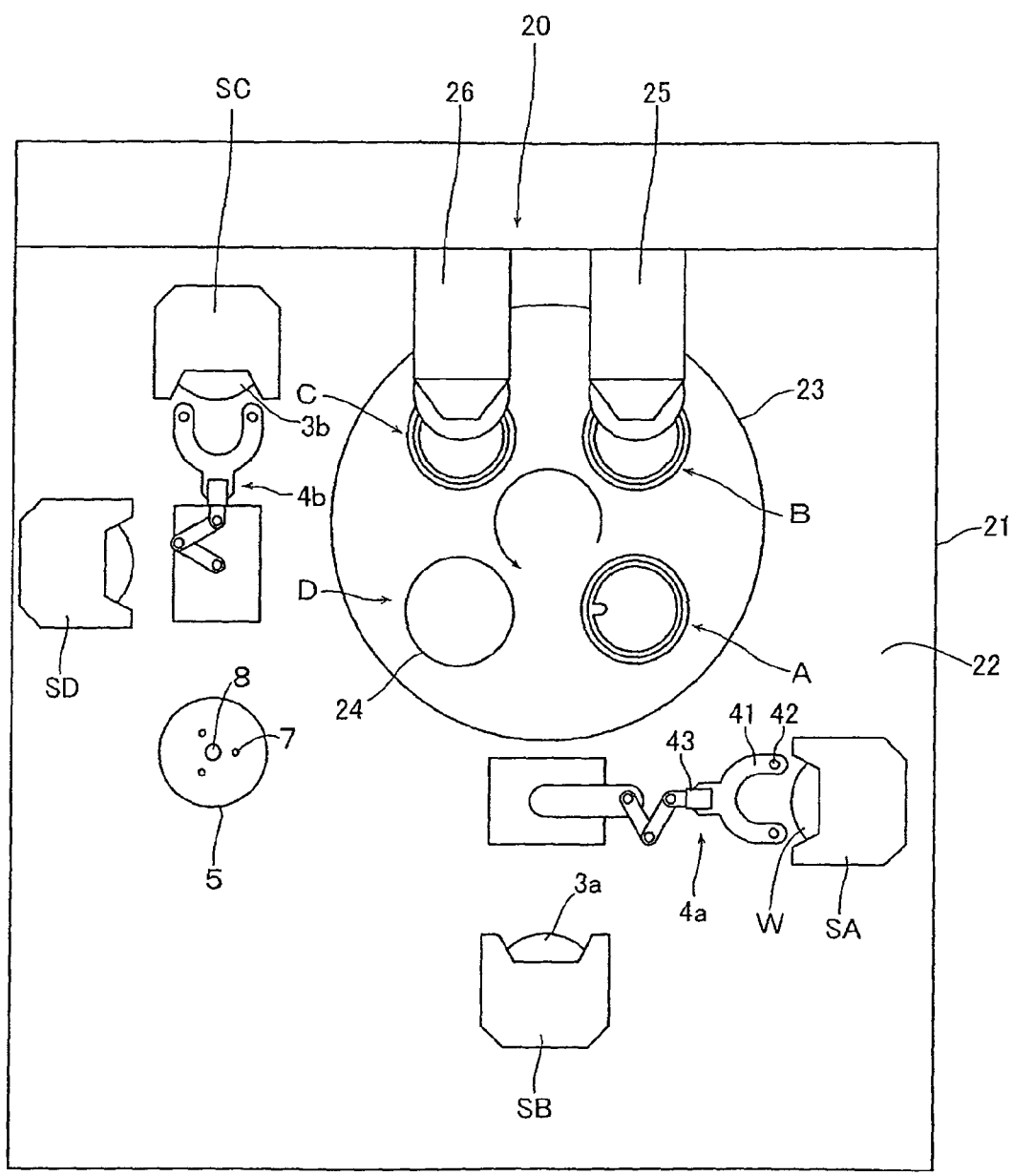
FIG. 5 is a plan view showing a modified example in which the wafer transport apparatus of this invention is built into a grinding apparatus.

DESCRIPTION OF REFERENCE NUMERALS AND CHARACTERS 1 wafer transport apparatus (work transport apparatus)
3 fixing jig
31 jig main body
32 close contact layer
33 supporting projection
34 side wall
35 partitioned space
36 ventilation hole
4 transporting means (work handover mechanism)
41 finger portion
43 motor (reversing mechanism)
5 attaching/detaching portion (work handover mechanism)
W wafer
S1, S2 protecting structural body housing portion
S3 jig standby portion

What is claimed is:

1. A method of transporting a work comprising the steps of:
fixing a first fixing jig in close contact with one surface of a thin plate-like work and performing a predetermined processing on an opposite surface of the work, or fixing a first fixing jig in close contact with one surface of a thin plate-like work in which said one surface has been subjected to a predetermined processing; and subsequently fixing a second fixing jig in close contact with the opposite surface of the work so as to sandwich the work between the first and second fixing jigs; and handing over the work to the second fixing jig, wherein each of the first fixing jig and the second fixing jig comprises: a plate-like jig main body; and a close contact layer which is disposed on one surface of the jig main body so as to detachably hold the work in close contact with the close contact layer, wherein the jig main body has on said one surface thereof a plurality of supporting projections which support the close contact layer, and a side wall along a peripheral portion of said one surface of the jig main body, the side wall having substantially an equal height as the supporting projections, the close contact layer being adhered to an end surface of the side wall thereby defining a partitioned space enclosed by the side wall between the close contact layer and the jig main body, wherein the jig main body has formed therein a ventilation hole which is in communication with the partitioned space such that the close contact layer is deformed by sucking air within the partitioned space via the ventilation hole, thereby lessening the hold of the close contact layer upon the work, and wherein the handing of the work from the first fixing jig to the second fixing jig is performed by first deforming the close contact layer of the first fixing jig so as to lessen its hold upon the work and by thereafter removing the first fixing jig from the work by relatively moving the first fixing jig and the second fixing jig away from each other, thereby leaving the work fixed in close contact to the second fixing jig.

\* \* \* \* \*